United States Patent [19]
Chuang

[11] Patent Number: 5,901,153
[45] Date of Patent: May 4, 1999

[54] DYNAMIC RANDOM ACCESS MEMORY CLASSIFICATION METHOD

[75] Inventor: Ching-Tsan Chuang, Chung Li, Taiwan

[73] Assignee: Behavior Tech Computer Corp., Taipei, Taiwan

[21] Appl. No.: 08/927,400

[22] Filed: Sep. 10, 1997

[51] Int. Cl.[6] .......................... G06F 13/00; G06F 19/00; G06F 17/00

[52] U.S. Cl. ..................................... 371/21.4; 364/478.18; 364/478.11; 364/478.02; 364/468.03; 364/468.19

[58] Field of Search .................................. 371/21.4, 21.1; 364/552, 570, 468.03, 468.02, 478.18, 478.12, 478.01, 478.02; 711/105

[56] References Cited

U.S. PATENT DOCUMENTS

| | | | |
|---|---|---|---|
| 4,698,766 | 10/1987 | Entwistle et al. ........................ | 364/468 |
| 4,827,423 | 5/1989 | Beasely et al. .......................... | 364/468 |
| 5,806,069 | 9/1998 | Wakiyama et al. ..................... | 707/102 |
| 5,844,803 | 12/1998 | Beffa ................................. | 364/468.28 |

*Primary Examiner*—Robert W. Beausoliel, Jr.
*Assistant Examiner*—Norman Michael Wright
*Attorney, Agent, or Firm*—Rosenberg, Klein & Bilker

[57] ABSTRACT

A dynamic random access memory (DRAM) classification method is disclosed, including a test/classification apparatus controlled by a test/classification control process. The test/classification apparatus includes a programmable logic control (PLC), test devices, a conveyor device, electromagnetic driver devices, a man-machine interface, sensors and an alarm. The PLC is operated in accordance with the test/classification control process to control the test devices for performing test on DRAMs supplied from at least two supply rails. The electromagnetic driver devices are then used to move the DRAMs so tested to the conveyor device which in turn conveys the DRAMs to a particular collection position in accordance with the characteristic value obtained in the test, which characteristic value being within a particular class of DRAM associated with such a particular collection position, to achieve conveyance and classification of the DRAM. The man-machine interface provides a manual control and access to the steps of the test/classification control process of the DRAM. The sensors and the alarm are to detect the condition of out-of-supply of DRAM and to provide a warning of the out-of-supply condition.

9 Claims, 4 Drawing Sheets

DYNAMIC RANDOM ACCESS MEMORY CLASSIFICATION METHOD

FIELD OF THE INVENTION

The present invention relates generally to a method of classifying dynamic random access memories (DRAMs) and in particular to a DRAM classification method which tests the DRAMs to obtain characteristic values thereof, defining the performances thereof and selectively collect the DRAMs in different groups in accordance with the characteristic values that define the erformances of the DRAMs.

BACKGROUND OF THE INVENTION

Dynamic random access memories (DRAMs) have been widely used in for example personal computers, monitor interface circuits, input/output control interface circuits and other computer peripheral devices. Since these circuits or devices require different electric characteristics, the DRAMs adopted in these different circuits have to have different electric characteristics. Thus, the DRAMs have to be classified in advance in accordance with the characteristic values thereof to facilitate adoption in different circuits and to meet different electric requirements thereof.

Conventionally, the DRAMs are tested and classified manually which is not only time-consuming and labor-intensive, making the cost of the DRAMs high, but is also subject to error caused by human factors. Thus the DRAMs that are manually tested and classified as the same class or grade may still have a great difference in performance therebetween and thus affecting the correctness of the classification operation.

Thus, it is desirable to provide a DRAM classification method which is carried out automatically and the DRAMs so tested and classified are individually collected in accordance with the class thereof associated with the test result so as to overcome the deficiencies encountered in the prior art.

SUMMARY AND OBJECTS OF THE INVENTION

Therefor, the primary object of the present invention is to provide a DRAM classification method which carries out DRAM test and classification process automatically, minimizing the human labor needed, cutting down the cost and time needed to test and classify the DRAMs and eliminating the errors caused by human factor.

To achieve the above object, in accordance with the present invention, there is provided a DRAM classification method in which a test/classification apparatus is involved and controlled by a test/classification control process. The test/classification apparatus comprises a programmable logic control (PLC), test devices, a conveyor device, electromagnetic driver devices, a man-machine interface, sensors and an alarm. The PLC is operated in accordance with the test/classification control process to control the test devices for performing test on DRAMs supplied from at least two supply rails. The electromagnetic driver devices are then used to move the DRAMs so tested to the conveyor device which in turn conveys the DRAMs to a particular collection position in accordance with the characteristic value obtained in the test, which characteristic value being within a particular class of DRAM associated with such a particular collection position, to achieve conveyance and classification of the DRAM. The man-machine interface provides a manual control and access to the steps of the test/classification control process of the DRAM. The sensors and the alarm are to detect the condition of out-of-supply of DRAM and to provide a warning of the out-of-supply condition.

BRIEF DESCRIPTION OF THE DRAWINGS

To have the present invention more fully understood, a detailed description of the preferred embodiment of the present invention is given as follows, with reference to the accompanying drawings, wherein.

DETAILED DESCRIPTION OF THE PREFERRED EMBODIEMNT

Figure 1:
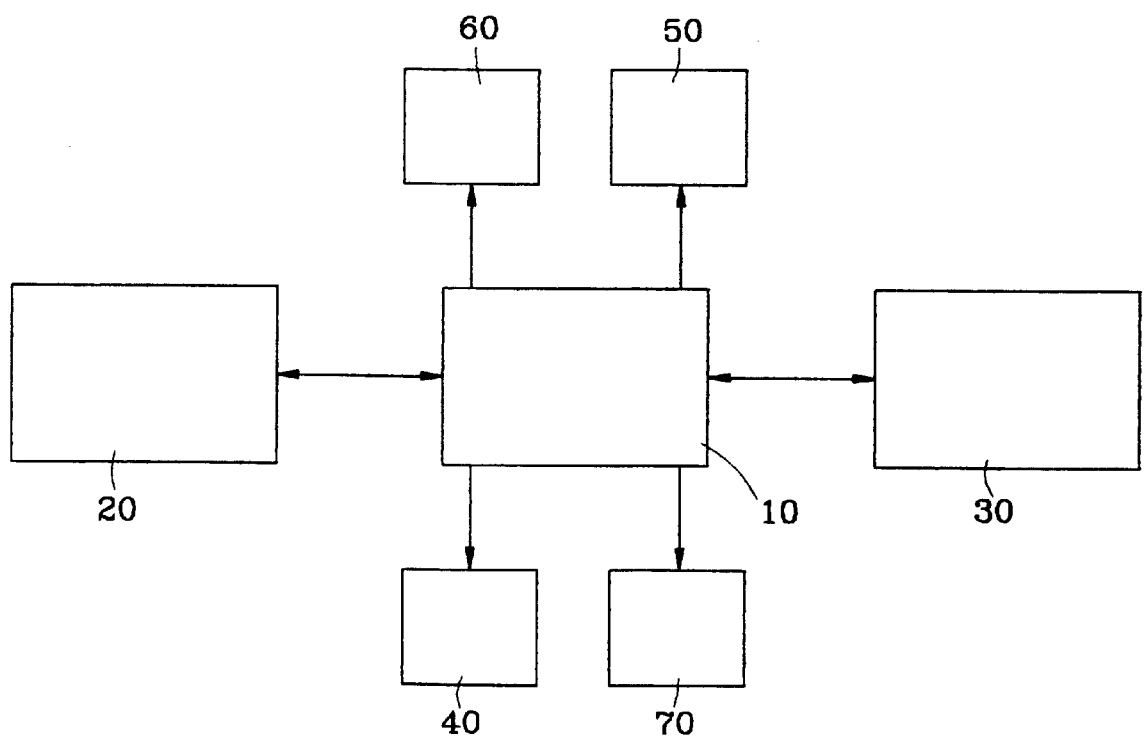
FIG. 1 is system block diagram of the test/classification apparatus in accordance with the present invention.

With reference to the drawings and in particular to FIG. 1, which shows a DRAM test/classification apparatus in accordance with the present invention, generally designated at 100, the test/classification apparatus 100 comprises a programmable logic control (PLC) 10 for controlling the overall operation of the apparatus 100, testing means comprises at least one test device 20, each being associated with one DRAM supply rail (to be described hereinafter) and controlled by the PLC 10 to sequentially test a number of DRAMs from the DRAM supply rail and to obtain and forward the characteristic values thereof obtained in the test results to the PLC 10 to serve as the basis for classification, a conveyor device 30 which is controlled by the PLC 10 to convey the DRAMs to particular collection positions associated with particular classes in accordance with the characteristic values from the test device 20.

A plurality of electromagnetic drivers 40 which are controlled by the PLC 10 to control the operations of the test device 20 and the conveyor device 30. Sensor means 50 and an alarm device 60 are provided to detect the out-of-supply condition in the test device 20 and the conveyor device 30 and to give off an alarm signal of the out-of-supply condition in order to inform an in-site operator or a remotely monitoring personnel of the problem. A man-machine interface 70 provides a manual control to the in-site operator or a remotely monitoring personnel to control the testing, classifying and conveying operation so as to allow the operator or the monitoring personnel to remove the out-of-supply problem and other malfunctions. Thus, preferably, the man-machine interface 70 is connected to the PLC 10 or connected to a remote monitor device to be operated by the operator or personnel.

Figure 2:
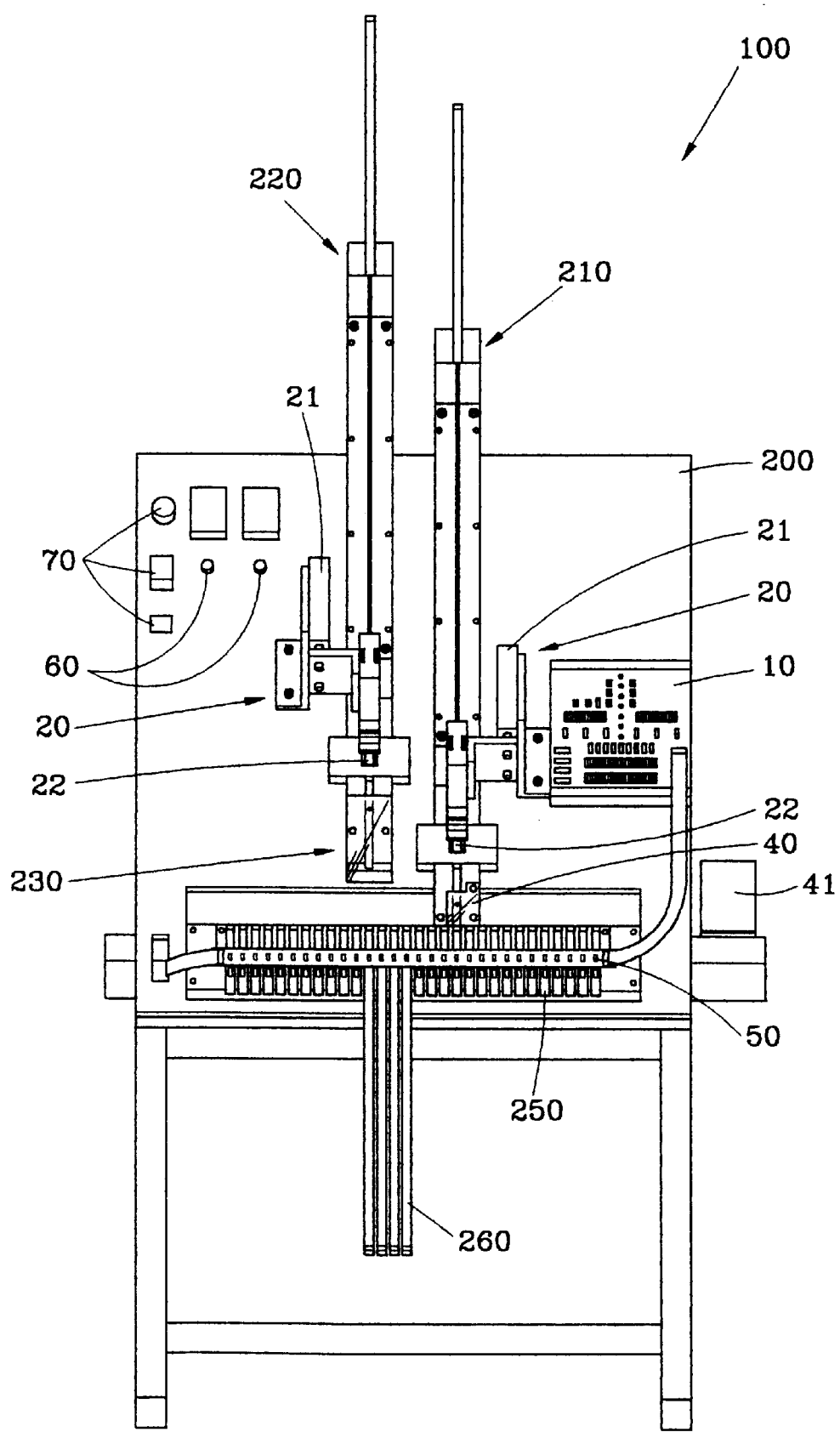
FIG. 2 is a front view showing the test/classification apparatus in accordance with a preferred embodiment of the present invention.

With reference to FIG. 2, which shows a front view of a preferred form of the DRAM test/classification apparatus 100 in accordance with the present invention, the preferred form of the apparatus 100 is for illustration only, not to limit the scope of the present invention. The DRAM test/classification apparatus 100 comprises a machine base 200 having at least one first supply rail 210 and one second supply rail 220, each having a test device 20 associated therewith so that the testing means comprises two test devices 20. Preferably the supply rails 210 and 220 are substantially parallel with each other and capable to hold a number of DRAMs to be tested therein. Preferably, the DRAMs are deposited over each other in the supply rail 210 or 220 to form a linear stack of DRAMs. The PLC 10, the test devices 20 and the conveyor device 30 discussed above with reference to FIG. 1 are all arranged on the machine base 200 to have the test devices 20 adjacent immediately to lower ends of the first supply rail 210 and the second supply rail 220. A buffering zone 230 is provided below the test device 20 of the second supply rail 220 and the provision of the buffering zone 230 is to allow the testing operations performed on the first supply rail 210 and the second supply rail 220 may be carried out simultaneously with the tested DRAM of the second supply rail 220 being temporarily held in the buffering zone 230 to wait to be removed by the conveyor device 30 which is designed to remove the tested DRAM from the test device 20 associated with the first supply rail 210 first. The test devices 20 comprise a grasping device 21 and a testing seat 22 and the construction thereof is disclosed in a co-pending patent application so that details may not be given herein. The grasping device 21 is driven by the electromagnetic driver means 40 to pick up and move the DRAMs from the first supply rail 210 and the second supply rail 220 to the testing seats 22 and/or to pick up and move the tested DRAMs out of the testing seats 22 toward the conveyor device 40 or the buffering zone 230.

In FIG. 2, the conveyor device 30 is arranged below the test devices 20 and the buffering zone 230. The conveyor device 30 is driven by a motor 41 to move leftward and/or rightward to receive the tested DRAMs from the test devices 20 and the buffering zone 230 and to convey the DRAMs to a plurality of distribution rails 250 that are located below the conveyor device 30 and each associated with a class of the DRAMs to allow the DRAMs to be distributed into a plurality of tubular collection members 260 that are mounted to the lower sides of the distribution rails 250. The buffering zone 230 and the conveyor device 30 are both operated and controlled by the electromagnetic driver means 40 (not shown in the drawings).

The sensor means comprises a plurality of individual sensors 50 which are arranged between the first supply rail 210 and the second supply rail 220 and the test devices 20 associated with the supply rails 210 and 220 and mounted on the buffering zone 230, the conveyor device 40 and the distribution rails 250 to detect the out-of-supply and malfunction conditions. The alarm 70 operates in response to the out-of-supply and malfunction conditions detected by the sensor means 50 to generate an alarm signal for informing the in-site operator or the remotely monitoring personnel to fix the problems via the man-machine interface 70.

Figure 3:
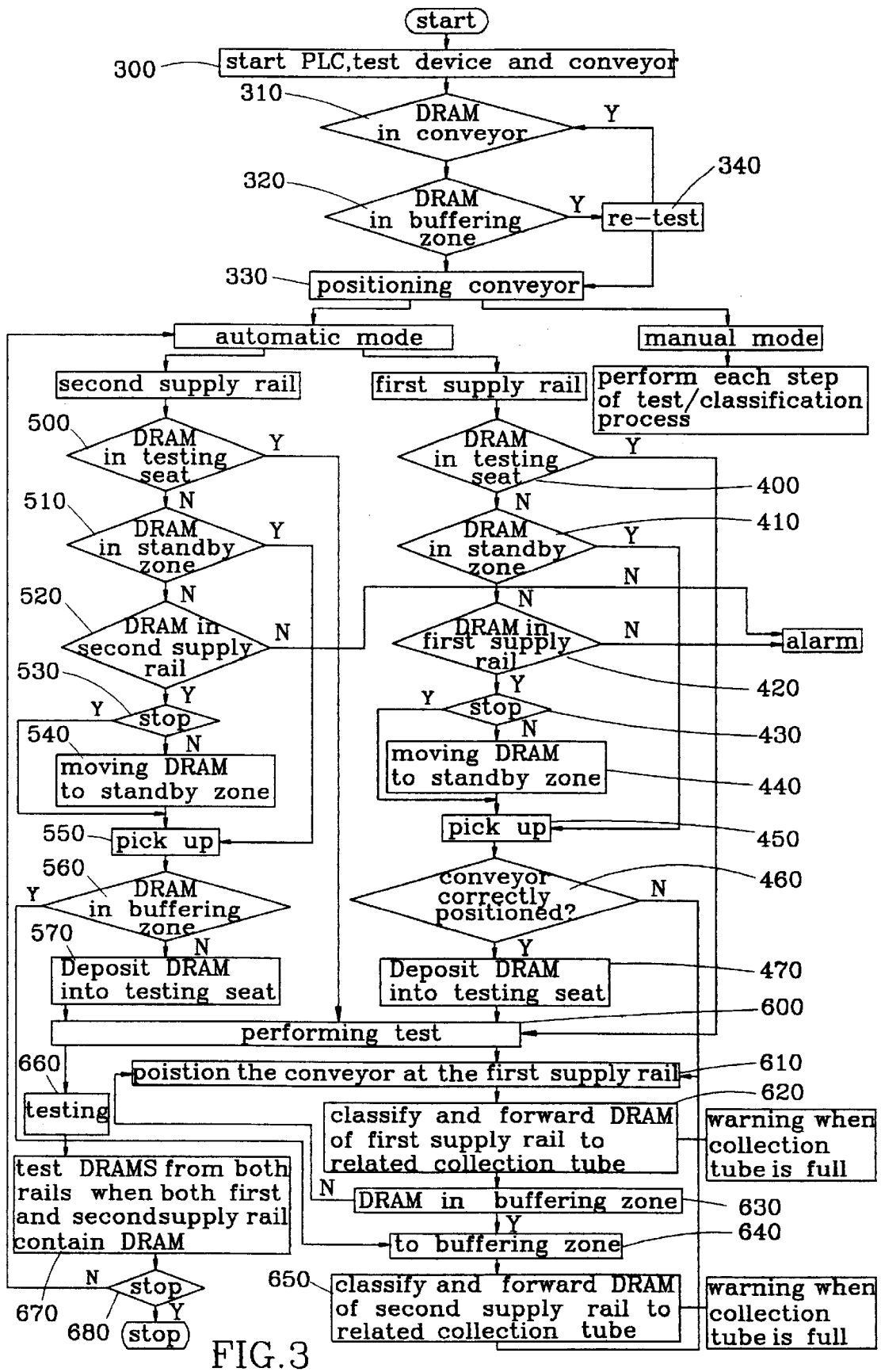
FIG. 3 is a flow chart demonstrating the test/classification control process in accordance with the present invention.

Further referring to FIG. 3, which shows a flow chart of the classification control process in accordance with the method of the present invention, the process is incorporated in the PLC 10, comprising a start checking routine, a test/classification routine and malfunction alarm routine. The start checking routine, as indicated at steps 300–340, starts initialization of the PLC 10, the test devices 20 and the conveyor device 30 and checks the conveyor device 30 and the buffering zone 230 that is shown in FIG. 2 with the sensor means 50 to see if there is any DRAM that has been left therein in the previous operation. If there is such a DRAM, then the DRAM is conveyed to a particular collection tube 260 for re-test to be re-deposited into the first supply rail 210 or the second supply rail 220 for re-testing. If there is no such a DRAM, then the conveyor device 30 is moved to be located under the test device 20 associated with the first supply rail 210 and standby there.

Once the start checking routine is completed, the test/classification routine is carried out. The test/classification routine comprises an automatic mode and a manual mode which may be switched from each other by means of the man-machine interface 70. The automatic mode is illustrated in steps 400–680 of which steps 400–470 and 600–650 are associated with test performed on the DRAMs from the first supply rail 210. At first, the sensor means 50 sequentially checks if there is DRAM present in the testing seat 22 of the test device 20, a standby zone at lower end of the first supply rail 210 and the first supply rail 210 itself and then, in accordance with the detection of the sensor means 50, the DRAM is moved to the standby zone of the first supply rail 210 and/or picked up from the standby zone and the conveyor device 30 is checked if being correctly positioned. Thereafter, the grasping device 21 of the test device 20 is driven to pick up the DRAM and deposit the DRAM into the testing seat 22 to carry out the test. The DRAM from the first supply rail 210 that has been tested and the characteristic value thereof obtained is then moved by the conveyor device 30 to a particular collection tube 260 associated with the class having a characteristic value range within which the characteristic value of the tested DRAM falls. Thereafter, the buffering zone 230 below the test device 20 associated with the second supply rail 220 is checked to see if there is a tested DRAM present to be moved to the collection tubes 260. If there is such a DRAM present, then the conveyor device 30 is moved to the location below the buffering zone 230 to receive the DRAM and forward it to a particular collection tube 260 associated with the class to which it belongs in accordance with the characteristic value obtained in the test. In the above steps, if an out-of-supply condition or a malfunction is detected by the sensor means 50, then the operation is terminated at the next step and the control process is directed to the malfunction alarm routine.

Steps 500–570, 600, 670 and 680 are associated with the test operation of the DRAMs from the second supply rail 220. Steps 500–570 and 600 are identical to those of the test operation associated with the first supply rail 210 and the difference therebetween is step 560 which is to check if there is DRAM present in the buffering zone 230. If there is such a DRAM, then steps 640 and 650 are taken to have the DRAM moved by the conveyor device 30 from the buffering zone 230 to the related collection tube 260 and if there is no DRAM in the buffering zone 230, then the grasping device 21 of the test device 20 picks up the DRAM in the standby zone of the second supply rail 220 and deposits the DRAM into the testing seat 22 to carry out the test and at the same time picks up the tested DRAM that is located in the testing seat 22 and puts it into the buffering zone 230, waiting to be moved to the related collection tube 260. If any one of the first and second supply rails 210 and 220 is out of supply of DRAM, then the dual supply fashion discussed above will be abolished and will not be resumed until both the first and second supply rails 210 and 220 are both filled with DRAMs. Under such a condition of out-of-supply of DRAM, the malfunction alarm routine is executed. Although in the embodiment illustrated, two DRAM supply rails are used which forms a dual supply system of DRAMs, yet it is apparent that it could be expanded to a multiple supply system of DRAMs in which more than two DRAM supply rails are incorporated in the apparatus 100.

The manual mode is provided for removing malfunction condition by the operator or for detection of malfunctioning device of the system. The manual mode is operated via the man-machine interface 70 to follow the steps of the automatic mode discussed above in order to individually perform the operation of each step to find out and correct the malfunction.

Figure 4:
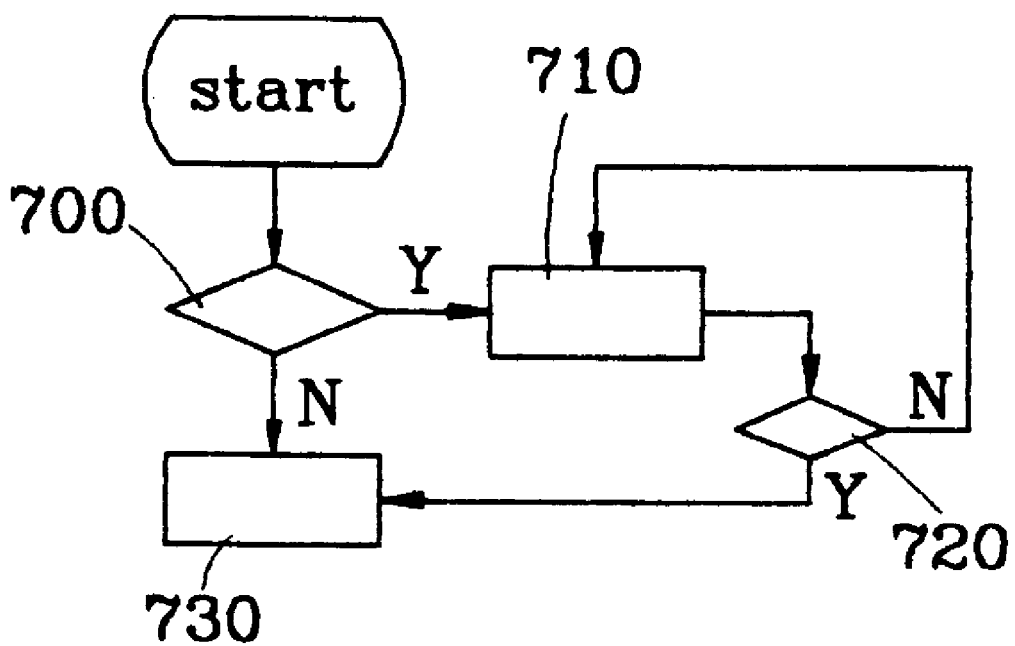
FIG. 4 is a flow chart showing the removal of malfunction encountered in the test/classification control process of the present invention.

With reference to FIG. 4, which shows the malfunction alarm routine adopted in the present invention, in the automatic mode, when the sensor means 50 detects an out-of-supply condition or a malfunction or the electromagnetic driver means 40 being malfunction, steps 700–730 are performed to decide the malfunction condition and then an alarm signal is given off by the alarm device 60 to inform the operator to remove the malfunction. Once the malfunction is removed by the operator through the man-machine interface 70 or DRAMs are supplied to the supply rails to overcome the out-of-supply problem, then the operation back to the step of the test/classification routine where the routine is temporarily held for malfunction or out-of-supply problem.

From the above description of the technique, the principle and the operation of the present invention, the advantages, effectiveness and industrial value thereof may be summarized as follows:

(1) DRAMs may be tested and classified in a fully automatic manner and thus the human labor needed is greatly reduced and cost and time necessary for classification of the DRAMs may be cut down.

(2) Using the automatic test devices 20 to perform test and classification operations on the DRAMs allows the test and classification operations to be performed in a more precise manner and the errors occurring in the classification of the DRAMs reduced.

(3) An alarm 60 is incorporated in the apparatus 100 of the present invention so that the conditions of out-of-supply of DRAM and/or malfunction may be detected immediately.

(4) The man-machine interface 70 allows the operator to remove the malfunction under the manual mode which enhances the maintenance and repair of the apparatus.

The above description is made with respect to the preferred embodiment of the present invention and for those skilled in the art, it is possible to made a variety of modifications and changes to the above-described embodiment without departing from the scope and spirit of the present invention. All these modifications and changes should be considered within the scope of the present invention as defined in the appended claims.

What is claimed is:

1. A dynamic random access memory (DRAM) classification method, comprising:

a test/classification apparatus comprising a programmable logic control (PLC) for controlling operation of the apparatus; testing means comprising at least one test device controlled by the PLC to sequentially test a number of DRAMs and obtain electric characteristic values of the DRAMs and send the characteristic values of the DRAMs so obtained to the PLC to serve as a basis for classification of the DRAMs; conveyor means operating in response to the PLC to sequentially convey the DRAMs that are tested to particular collection positions associated with the characteristic values thereof; electromagnetic driver means operating under the control of the PLC to control test and classification and positioning of the DRAMs of the testing means and the conveyor means; sensor means and alarm means for detecting an out-of-supply condition of the testing means and the conveyor means and for giving off an alarm indicating the out-of-supply condition; a man-machine interface providing a manual control of the operation of test, classification and conveyance of the DRAMs for facilitating removing the out-of-supply condition or fixing malfunction conditions; and a test/classification control process, comprising a start checking routine, a test/classification routine and a malfunction alarm routine, wherein the start checking routine is to check operations of starting the PLC, the testing means and the conveyor means; the sensor means being then used to check if a DRAM is present in the conveyor means; the test/classification routine is to control the DRAM fed into the testing means, test of the DRAM and deposition of the tested DRAM in the conveyor means and to control the conveyor means to forward the tested DRAM to an associated collection position; and the malfunction alarm routine is to give off alarm signal when the sensor means detects the out-of-supply condition or the malfunction of the electromagnetic driver means.

2. The DRAM classification method as claimed in claim 1, wherein the test/classification apparatus and the test/classification routine are capable to carry out a test and classification operation of the DRAM in a multiple supply fashion in which at least two supply rails supply the DRAMs to the apparatus simultaneously.

3. The DRAM classification method as claimed in claim 2, wherein the test/classification apparatus comprises a first supply rail and a second supply rail receiving and holding the DRAMs therein, each of the first and second supply rails having a test device of the testing means associated therewith and arranged below the supply rail to pick up the DRAMs from standby locations in the first and second supply rails for performing tests on the DRAMs so picked up, the first and second supply rails being provided with sensing elements of the sensor means to detect the out-of-supply condition.

4. The DRAM classification method as claimed in claim 3, wherein the first supply rail and the second supply rail are arranged to be substantially parallel with each other.

5. The DRAM classification method as claimed in claim 3, wherein the test device below the second supply rail comprises a buffering zone located below the test device for temporarily holding a tested DRAM from the second supply rail so as to allow the conveyor means to be capable to handle tested DRAMs from the two test devices of the first and second supply rails.

6. The DRAM classification method as claimed in claim 5, wherein the conveyor means and the buffering zone are controlled by the electromagnetic driver means to feed the DRAM out.

7. The DRAM classification method as claimed in claim 1 or 3, wherein the test devices of the testing means of the test/classification apparatus comprise a grasping device and a testing seat, the grasping device picking up the DRAM from the standby zone of the associated supply rail and depositing the DRAM so picked up to the testing seat and picking up the tested DRAM from the testing seat and depositing the tested DRAM to the conveyor means.

8. The DRAM classification method as claimed in claim 1, wherein the conveyor means comprises a plurality of distribution rails arranged below the conveyor means, each of the distribution rails having a collection tube associated with a particular class of the DRAMs to receive and hold the tested DRAMs having the characteristic value of the class therein.

9. The DRAM classification method as claimed in claim 1, wherein the man-machine interface is in connection with the PLC or a remote monitoring devie to be operable by the operator.

* * * * *